(12) United States Patent
Kang et al.

(10) Patent No.: US 12,424,773 B2
(45) Date of Patent: Sep. 23, 2025

(54) BOARD-TO-BOARD CONNECTION STRUCTURE FOR PCB

(71) Applicant: GUANGZHOU KANGLONG ELECTRONICS CO., LTD., Guangzhou (CN)

(72) Inventors: Tielong Kang, Guangzhou (CN); Zhiming Liang, Guangzhou (CN)

(73) Assignee: GUANGZHOU KANGLONG ELECTRONICS CO., LTD., Guangzhou (CN)

( * ) Notice: Subject to any disclaimer, the term of this patent is extended or adjusted under 35 U.S.C. 154(b) by 174 days.

(21) Appl. No.: 18/570,623

(22) PCT Filed: Jun. 22, 2022

(86) PCT No.: PCT/CN2022/100573
§ 371 (c)(1),
(2) Date: Dec. 14, 2023

(87) PCT Pub. No.: WO2022/268139
PCT Pub. Date: Dec. 29, 2022

(65) Prior Publication Data
US 2024/0291181 A1     Aug. 29, 2024

(30) Foreign Application Priority Data
Jun. 24, 2021  (CN) .......................... 202110707793.0

(51) Int. Cl.
*H05K 1/11*   (2006.01)
*H01R 12/52*  (2011.01)
*H05K 1/14*   (2006.01)

(52) U.S. Cl.
CPC ............. *H01R 12/52* (2013.01); *H05K 1/117* (2013.01); *H05K 1/144* (2013.01); *H05K 2201/041* (2013.01); *H05K 2201/09181* (2013.01)

(58) Field of Classification Search
CPC ........ H01R 12/52; H05K 1/117; H05K 1/144; H05K 2201/041; H05K 2201/09181
(Continued)

(56) References Cited

U.S. PATENT DOCUMENTS 5,754,411 A  *  5/1998  Woychik ................ H05K 3/366
                                               361/784
6,496,384 B1 * 12/2002  Morales ................ H05K 3/366
                                                29/830

FOREIGN PATENT DOCUMENTS

CN    206907946 U    1/2018
CN    207427167 U    5/2018
(Continued)

OTHER PUBLICATIONS

International Search Report, with English translation, and Written Opinion of International Searching Authority for Application No. PCT/CN2022/100573, mailed Sep. 1, 2022 (12 pages).

*Primary Examiner* — Binh B Tran
(74) *Attorney, Agent, or Firm* — Nixon Peabody LLP

(57) ABSTRACT

A board-to-board connection structure for a PCB is disclosed. When a bottom board is welded to a functional board, weld legs thereof can be expanded in a perpendicular direction by means of a first bridge board, and the number of the weld legs of the bottom board to the functional board is no longer limited by the width of the functional board; a first partition board can prevent a short circuit between a third pad and a fourth pad on the functional board, and isolate a sixth pad on the first bridge board from a first pad on the bottom board; and at the same time, the first partition
(Continued)

board can connect a second pad on the bottom board to a fifth pad of the first bridge board.

18 Claims, 4 Drawing Sheets

(58) Field of Classification Search
USPC .......................................................... 361/792
See application file for complete search history.

(56) References Cited

FOREIGN PATENT DOCUMENTS

| | | |
|---|---|---|
| CN | 208638784 U | 3/2019 |
| CN | 110582160 A | 12/2019 |
| CN | 210670759 U | 6/2020 |
| CN | 113573471 A | 10/2021 |
| EP | 1804561 A1 | 7/2021 |

* cited by examiner

BOARD-TO-BOARD CONNECTION STRUCTURE FOR PCB

CROSS-REFERENCE TO RELATED APPLICATION

This application is a US national stage application of International Patent Application No. PCT/CN2022/100573, filed on Jun. 22, 2022, which claims the benefit of and priority to Chinese Patent Application No. 202110707793.0, which was filed with the Chinese Patent Office on Jun. 24, 2021, each of which is hereby incorporated by reference herein in its entirety.

TECHNICAL FIELD

The present disclosure relates to the technical field of circuit boards, and in particular to a board-to-board connection structure for a PCB (Printed circuit board).

BACKGROUND

PCB (which is called printed circuit board in Chinese), also known as printed circuit board, is an important electronic component, a support for electronic components, and a carrier for electrical interconnection of electronic components. Due to the fact that the PCB is manufactured by electronic printing, it is called "printed" circuit board.

In the current market, modular design is the current mainstream for PCB, while the connection between a functional module and a bottom board module generally requires the form of welding an additional connector or functional module board to the bottom board module, for example, the one-dimensional circuit board structure is to design related circuits only on one circuit board; the two-dimensional circuit board structure is to provide a circuit bottom board, and a plurality of functional module boards are vertically inserted on the circuit bottom board, and the connection and conduction between the functional module and the bottom board module are achieved.

However, in the process of implementing the prior art, the inventors of the present application found that there are at least the following technical problems in the prior art:

In a general PCB board in the prior art, the number of connecting pins between a bottom board and a functional board is relatively small, resulting in the number of weld legs leading out from the functional board being relatively small when the width of the functional board is limited.

SUMMARY

In order to solve the problem above, an objective of the present disclosure is to provide a board-to-board connection structure for a PCB, which is used to solve the technical problem that the number of connecting pins between a bottom board and a functional board in a general PCB in the prior art is relatively small, resulting in the number of weld legs leading out from the functional board being relatively small when the width of the functional board is limited.

In order to solve the technical problem above, the following technical solution is adopted in the embodiments of the present disclosure.

A board-to-board connection structure for a PCB provided by embodiments of the present disclosure includes:

a bottom board, which is provided with a first slot, where a first pad and a second pad are arranged on the bottom board;

a functional board, where a third pad and a fourth pad are arranged on the functional board;

a first partition board, where the first partition plate is provided with a second slot; and a first bridge board, which is provided with a third slot, where a fifth pad and a sixth pad are arranged on first bridge board.

The functional board penetrates through the first slot, the second slot and the third slot in sequence, so as to be installed on the bottom board, the first partition board and the first bridge board.

The third pad is connected to the first pad, and the fourth pad is connected to the sixth pad.

The fifth pad is connected to the second pad.

Further, multiple first pads are provided, which are arranged around an outer edge side of the first slot. The first pads are arranged on front and back surfaces of the bottom board, and the first pads on the front and back surfaces are mutually conductive.

Further, multiple second pads are provided, which are arranged around outer edge sides of the first pads. The second pads are arranged on front and back surfaces of the bottom board, and the second pads on the front and back surfaces are mutually conductive.

Further, multiple third pads are provided, which are transversely arranged on the functional board, respectively, and located on a corresponding upper surface of the functional board. Multiple fourth pads are provided, which are transversely arranged on the functional board, respectively, and located on a corresponding upper surface of the functional board.

Further, multiple fifth pads are provided, which are arranged around an outer edge side of the third slot. Each fifth pad is arranged on a surface of the first bridge board, and is connected to the sixth pad.

Further, multiple sixth pads are provided, which are arranged around outer edge sides of the fifth pads. Each sixth pad is arranged on a surface of the first bridge board.

Further, the first partition board is provided with a first through hole, and the fifth pad is welded to the second pad by means of the first through hole.

Further, the multiple second pads are provided, the number of the fifth pads and the number of the first through holes are the same as the number of the second pads, and positions of the second pads, the fifth pads and the first through holes are consistent.

Further, the second pads are located at the periphery of the first pads, and arranged around the first slot;

the fifth pads are located at the periphery of the sixth pads, and are arranged around the third slot; and the first through holes are arranged around the second slot.

Further, the fifth pad and the sixth pad are connected to each other.

Further, the first through hole is a semi-circular first through hole.

Further, each of the first pad, the fifth pad and the sixth pad is provided with the semi-circular through hole.

Further, the bottom board, the first partition board and the first bridge board are sequentially arranged in parallel, and the functional board is perpendicular to each of the bottom board, the first partition board and the first bridge board, respectively.

Further, the connection structure further includes:

a second partition board, which is provided with a fourth slot, second through holes arranged around the fourth slot, and third through holes arranged around the fourth slot and located at the periphery of the second through holes; and a second bridge board, which is provided with a fifth slot, and seventh pads, eighth pads and ninth pads which are arranged around the fifth slot, wherein the eighth pads are located at the periphery of the seventh pads, and the ninth pads are located at the periphery of the eight pads.

Tenth pads are further arranged on the functional board, and the tenth pads are located between the fourth pads and the third pads.

Eleventh pads are further arranged on the bottom board, and the eleventh pads are arranged around the first slot and located between the first pads and the second pads.

Further, the bottom of the functional board is inserted into the first slot, the fourth slot, the fifth slot, the second slot and the third slot in sequence, and thus the functional board is installed on the bottom board, the second partition board, the second bridge board, the first partition board, and the first bridge board.

The tenth pad is connected to the seventh pad.

The second pad is connected to the eighth pad by means of the second through hole, and the eighth pad is connected to the fifth pad by means of the first through hole.

The eleventh pad is connected to the ninth pad by means of the third through hole.

Further, the cross section of the first partition board is less than cross sectional area of the second partition board. The cross section of the first bridge board is less than cross sectional area of the second bridge board.

Further, two rows of through-hole pads on the outer side of the first bridge board are respectively welded to two rows of outermost first pads and two rows of secondary outermost second pads at an interface region of a functional module of the bottom board.

Compared with the prior art, the embodiments of the present disclosure have beneficial effects as follows:

A board-to-board connection structure for the PCB provided by the embodiments of the present disclosure includes a bottom board on which a first slot is provided and a first pad and a second pad are arranged; a functional board on which a third pad and a fourth pad are arranged; a first partition board on which a second slot is provided; and a first bridge board on which a third slot is provided and a fifth pad and a sixth pad are arranged. The functional board penetrates through the first slot, the second slot and the third slot in sequence, so as to be installed on the bottom board, the first partition board and the first bridge board. The third pad is connected to the first pad, the fourth pad is connected to the sixth pad, and the fifth pad is connected to the second pad.

In the board-to-board connection structure for the PCB provided by this embodiment, when the bottom board is relatively welded to the functional board, weld legs thereof can be expanded in a perpendicular direction by means of the first bridge board, and the number of the weld legs of the bottom board to the functional board is no longer limited by the width of the functional board, such that a perpendicular space is fully utilized. The first partition board can prevent a short circuit between the third pad and the fourth pad on the functional board, and isolate the sixth pad inside the first bridge board from the first pad on the bottom board module. Meanwhile, the first partition board can connect the second pad on the bottom board to the fifth pad of the first bridge board, thereby having a connection effect. Therefore, the technical problem that, in the general PCB in the prior art, the number of weld legs leading out from the functional board is relatively small when the width of the functional board is limited due to the fact that the number of weld legs between a bottom board and a functional board is relatively small is effectively solved.

BRIEF DESCRIPTION OF THE DRAWINGS

To describe the technical solutions in the embodiments of the present disclosure or in the prior art more clearly, the following briefly introduces the accompanying drawings required for describing the embodiments. Apparently, the accompanying drawings in the following description show merely some embodiments of the present disclosure, and those of ordinary skill in the art may still derive other drawings from these accompanying drawings without creative efforts.

Figure 1:
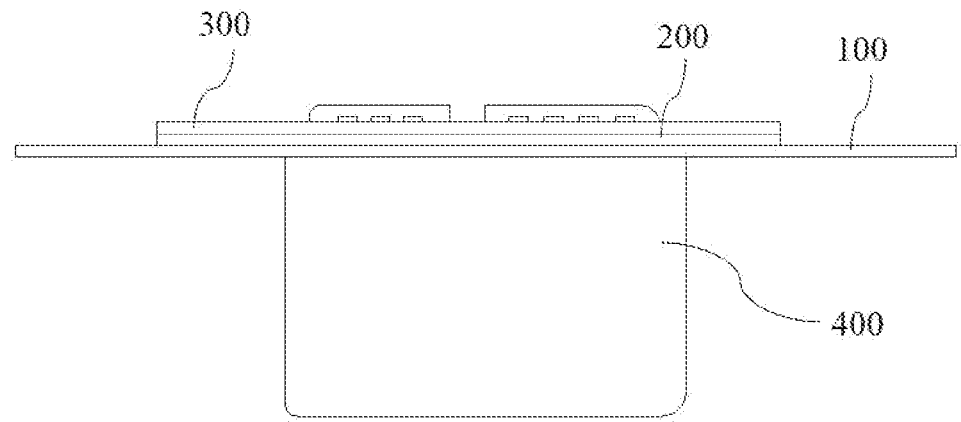
FIG. 1 is a structural schematic diagram of a board-to-board connection structure for a PCB provided by an embodiment.

In the drawings: 100—bottom board; 101—first pad; 102—second pad; 103—first slot; 200—first partition board; 201—second slot; 202—first through hole; 300—first bridge board; 301—third slot; 302—fifth pad; 303—sixth pad; 400—functional board; 401—third pad; 402—fourth pad; 500—second partition board; 600—second bridge board.

DETAILED DESCRIPTION OF THE EMBODIMENTS

The following clearly and completely describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

In the description of the present disclosure, it should be noted that the orientation or positional relationship indicated by terms "center", "upper", "lower", "left", "right", "vertical", "horizontal", "inside", "outside" is based on the orientation or positional relationship shown in the drawings only for convenience of description of the present disclosure and simplification of description rather than indicating or implying that the device or element referred to must have a particular orientation, be constructed and operate in a particular orientation, and thus are not to be construed as limiting the present disclosure. Furthermore, the terms "first", "second" and "third" are used for descriptive purposes only and are not to be construed as indicating or implying relative importance.

In the description of the embodiments of the present disclosure, it should be noted that, unless expressly specified and limited otherwise, the terms "install", "connect", "couple", "fix" and the like should be understood broadly, e.g., may be either a fixed connection or a replaceable connection, or an integrated connection; may be a mechanical connection or an electrical connection; may be a direct connection or an indirect connection through an intermediate medium, may be an internal communication between the two elements or interactions between the two elements. For those of ordinary skill in the art, the specific meanings of the above terms in the present disclosure can be understood on a case-by-case basis.

The specific embodiments of the present disclosure are further described in detail below with reference to the accompanying drawings and embodiments. The following embodiments are used for illustrating the present disclosure, rather than limiting the scope of the present disclosure.

Figure 2:
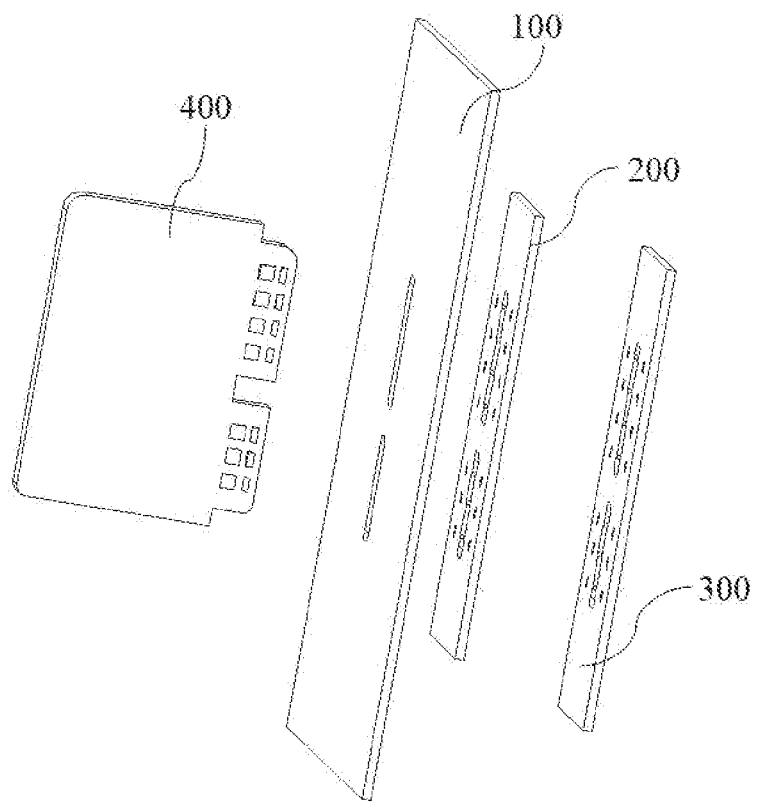
FIG. 2 is an exploded view of a board-to-board connection structure for a PCB provided by an embodiment.
Figure 3:
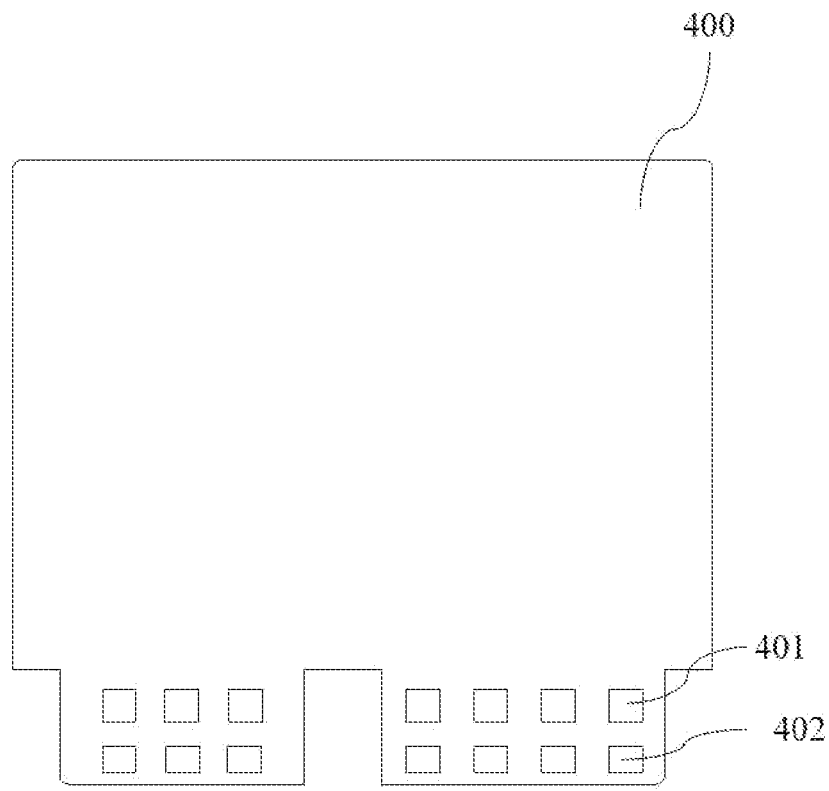
FIG. 3 is a structural schematic diagram of a functional board of a board-to-board connection structure for a PCB provided by an embodiment.
Figure 4:
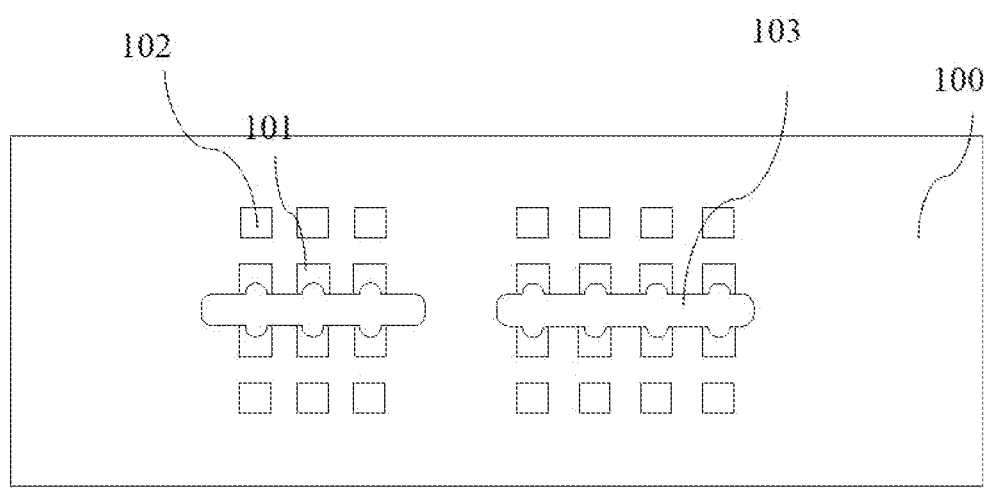
FIG. 4 is a structural schematic diagram of a bottom board of a board-to-board connection structure for a PCB provided by an embodiment.
Figure 5:
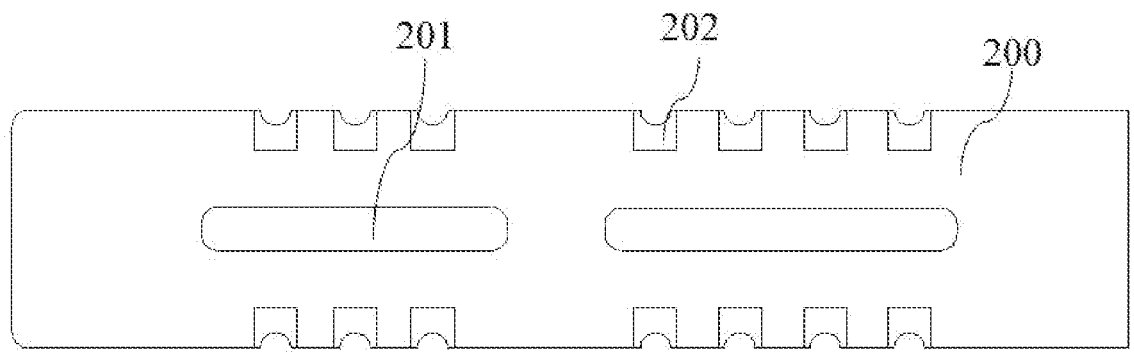
FIG. 5 is a structural schematic diagram of a first partition board of a board-to-board connection structure for a PCB provided by an embodiment.
Figure 6:
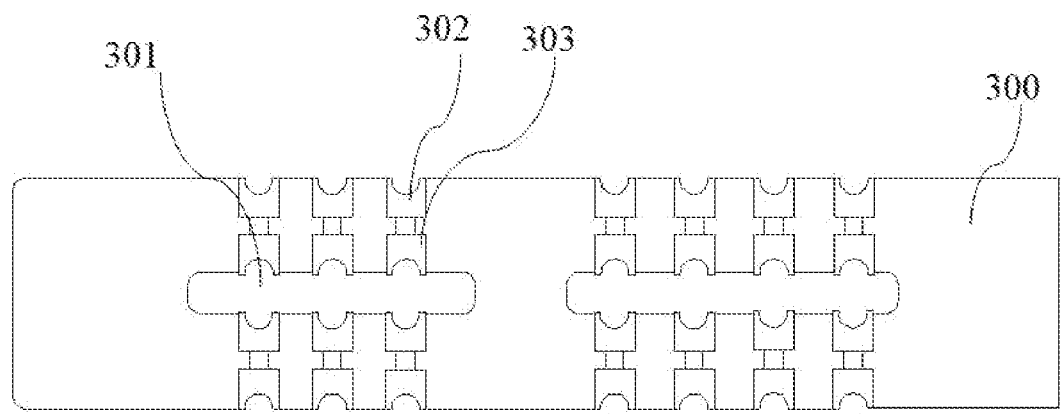
FIG. 6 is a structural schematic diagram of a first bridge board of a board-to-board connection structure for a PCB provided by an embodiment.
Figure 7:
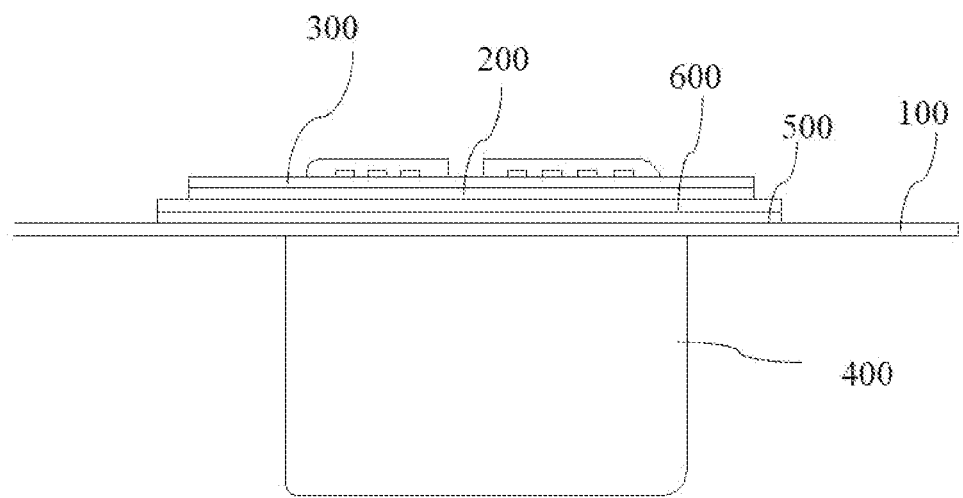
FIG. 7 is another structural schematic diagram of a board-to-board connection structure for a PCB provided by an embodiment.

As shown in FIG. 1 to FIG. 7, a board-to-board connection for a PCB is provided by the embodiments of the present disclosure.

The connection structure includes:

a bottom board 100 on which a first slot 103 is formed and first pads 101 and second pads 102 are arranged.

The bottom board 100 may be provided with multiple groups of first slots 103, the first pads 101, and the second pads 102, such that the bottom board 100 can be extended for further arrangement of more functional boards 400.

The multiple first pads 101 are provided, which are arranged around an outer edge side of the first slot 103. The first pads 101 are arranged on front and back surfaces of the bottom board 100, and the first pads 101 on the front and back surfaces are mutually conductive.

The multiple second pads 102 are provided, which are arranged around the outer edge sides of the first pads 101. The second pads 102 are arranged on the front and back surfaces of the bottom board 100, and the second pads 102 on the front and back surfaces are mutually conductive.

The connection includes a function board 400 on which third pads 401 and fourth pads 402 are arranged.

Multiple third pads 401 are provided, which are transversely arranged on the functional board 400 and located on a corresponding upper surface of the functional board 400.

Multiple fourth pads 402 are provided, which are transversely arranged on the functional board 400 and located on a corresponding upper surface of the functional board 400.

The connection structure further includes a first partition board 200 on which a second slot 201 is formed; and a first bridge board on which a third slot 301 is formed and fifth pads 302 and sixth pads 303 are arranged.

Multiple fifth pads 302 are provided, which are arranged around an outer edge side of the third slot 301. The fifth pads 302 are arranged on a surface of the first bridge board, and the fifth pads 302 are connected to the sixth pads 303.

Multiple sixth pads 303 are provided, which are arranged around outer edge sides of the fifth pads 302, and the sixth pads 303 are arranged on a surface of the first bridge board.

The functional board 400 penetrates through the first slot 103, the second slot 201 and the third slot 301 in sequence, so as to be installed on the bottom board 100, the first partition board 200 and the first bridge board.

The third pad 401 is connected to the first pad 101, and the fourth pad 402 is connected to the sixth pad 303.

The fifth pad 302 is connected to the second pad 102.

According to a board-to-board connection structure for a PCB, when the bottom board 100 is relatively welded to the functional board 400, weld legs thereof can be expanded in a perpendicular direction by means of the first bridge board, and the number of the weld legs of the bottom board to the functional board is no longer limited by the width of the functional board, such that a perpendicular space is fully utilized. The first partition board 2000 can prevent a short circuit between the third pad 401 and the fourth pad 402 on the functional board, and isolate the sixth pad 303 inside the first bridge board from the first pad 101 on a bottom board 100 module. Meanwhile, the first partition board 200 can connect the second pad 102 on the bottom board 100 to the fifth pad 302 of the first bridge board, thereby having a connection effect. Therefore, the technical problem that, in the general PCB in the prior art, the number of weld legs leading out from the functional board is relatively small when the width of the functional board is limited due to the fact that the number of weld legs between the bottom board 100 and a functional board 400 is relatively small is effectively solved.

Further, the first partition board 200 is provided with a first through hole 202, and the fifth pad 302 is welded to the second pad 102 by means of the first through hole 202.

The first through hole 202 in the first partition board 200 enables a communication position between the fifth pad 302 and the second pad 102, such that the first partition board 200 can prevent a short circuit between the third pad 401 and the fourth pad 402 on the function board 400, and isolate the sixth pad 303 inside the first bridge board 300 from the first pad 101 on the bottom board 100 module. Meanwhile, the first partition board 200 can connect the second pad 102 on the bottom board 100 to the fifth pad 302 of the first bridge board 300, thereby having a connection effect.

Further, multiple second pads 102 are provided, the number of the fifth pads 302 and the number of the first through holes 202 are the same as the number of the second pads 102, and positions of the second pads, the fifth pads and the first through holes are consistent.

As above, the number of the second pads 102 may be five or ten, the number and position of the first through holes 202 and the number and position of the fifth pads 302 are consistent with the number and position of the second pads 102. One second pad 102 corresponds to one first through hole 202 and one fifth pad 302.

The second pads 102 are located at the periphery of the first pads 101, and arranged around the first slot 103.

The fifth pads 302 are located at the periphery of the sixth pads 303, and are arranged around the third slot 301.

The first through holes 202 are arranged around the second slot 201.

As above, the position of the second pad 102 is consistent with the position of the fifth pad 302, such that the weld legs can be effectively extended by means of the first bridge board. When the bottom plate is vertically welded to the functional board 400 by means of the first bridge board, weld legs thereof can be expanded in a perpendicular direction, and the number of the board-to-board weld legs is no longer limited by the width of the functional board 400, such that the perpendicular space is fully utilized.

Further, the fifth pad 302 and the sixth pad 303 are connected to each other.

Further, the first through hole 202 is a semi-circular first through hole 202.

Further, each of the first pad 101, the fifth pad 302 and the sixth pad 303 is provided with the semi-circular through hole.

The semi-circular first through holes 202 are respectively arranged on both outer sides of the first partition board 200 for connecting the semi-circular holes of the second pads 102 on a bottom board 100 module and the semi-circular holes of the fifth pads 302 on the both outer sides of the bridge board, thereby having a direct connection effect.

Further, the bottom board 100, the first partition board 200 and the first bridge board are sequentially arranged in parallel, and the functional board 400 is perpendicular to each of the bottom board 100, the first partition board 200 and the first bridge board.

More space for the extending of the weld legs can be provided as the functional board 400 is perpendicular to the bottom board 100, the first partition board 200 and the first bridge board.

Further, the connection structure further includes:
a second partition board 500, which is provided with a fourth slot, second through holes arranged around the fourth slot, and third through holes arranged around the fourth slot and located at the periphery of the second through holes; and
a second bridge board 600, which is provided with a fifth slot, and seventh pads, eighth pads and ninth pads which are arranged around the fifth slot, where the eighth pads are located at the periphery of the seventh pads, and the ninth pads are located at the periphery of the eight pads.

Tenth pads are further arranged on the functional board 400, and the tenth pads are located between the fourth pads 402 and the third pads 401.

Eleventh pads are further arranged on the bottom board 100, the eleventh pads are arranged around the first slot 103 and located between the first pads 101 and the second pads 102.

The bottom of the functional board 400 is inserted into the first slot 103, the fourth slot, the fifth slot, the second slot 201 and the third slot 301 in sequence, and thus the functional board 400 can be installed on the bottom board 100, the second partition board 500, the second bridge board 600, the first partition board, and the first bridge board.

The tenth pad is connected to the seventh pad.

The second pad 102 is connected to the eighth pad by means of the second through hole, and the eighth pad is connected to the fifth pad 302 by means of the first through hole 202.

The eleventh pad is connected to the ninth pad by means of the third through hole.

By superposing the second partition board 500 and the second bridge board 600, the weld legs can be further extended, and thus can be further expanded by means of the second bridge board 600.

Further, the cross section of the first partition board 200 is less than cross sectional area of the second partition board 500. The cross section of the first bridge board is less than cross sectional area of the second bridge board.

The second partition board 500 is larger than the first partition board 200, similarly, a N-th partition board is larger than a N−1-th partition board.

Both outer sides of the first partition board 200 are provided with the semi-circular first through holes 202. Two rows of through-hole pads on the outer side of the first bridge board are respectively welded to two rows of outermost first pads 101 and two rows of secondary outermost second pads 102 at an interface region of a functional module of the bottom board 100.

Finally, it should be noted that the above embodiments are only used to illustrate the technical solutions of the present disclosure rather than limiting the same. Although the present disclosure has been described in detail with reference to the foregoing embodiments, it should be understood by those of ordinary skill in the art that it is still possible to modify the technical solutions recorded in the foregoing embodiments, or to equivalently replace some or all of technical features; and that these modifications or replacements do not make the essence of the corresponding technical solutions deviate from the scope of the technical solutions of the embodiments of the present disclosure.

What is claimed is:

1. A board-to-board connection structure for a PCB (printed circuit board), comprising:
a bottom board, wherein the bottom plate is provided with a first slot, and a first pad and a second pad are arranged on the bottom plate;
a functional board, wherein a third pad and a fourth pad are arranged on the functional board;
a first partition board, wherein the first partition plate is provided with a second slot; and
a first bridge board, wherein the first bridge board is provided with a third slot, and a fifth pad and a sixth pad are arranged on the first bridge board;
wherein the functional board penetrates through the first slot, the second slot and the third slot in sequence, so as to be installed on the bottom board, the first partition board and the first bridge board;
the third pad is connected to the first pad, and the fourth pad is connected to the sixth pad; and
the fifth pad is connected to the second pad.

2. The board-to-board connection structure for a PCB according to claim 1, wherein a plurality of first pads are provided, which are arranged around an outer edge side of the first slot; and the first pads are arranged on front and back surfaces of the bottom board, and the first pads on the front and back surfaces are mutually conductive.

3. The board-to-board connection structure for a PCB according to claim 1, wherein a plurality of second pads are provided, which are arranged around outer edge sides of the first pads; and the second pads are arranged on front and back surfaces of the bottom board, and the second pads on the front and back surfaces are mutually conductive.

4. The board-to-board connection structure for a PCB according to claim 1, wherein a plurality of third pads are provided, which are transversely arranged on the functional board, respectively, and located on a corresponding upper surface of the functional board; and a plurality of fourth pads are provided, which are transversely arranged on the functional board, respectively, and located on a corresponding upper surface of the functional board.

5. The board-to-board connection structure for a PCB according to claim 1, wherein a plurality of fifth pads are provided, which are arranged around an outer edge side of the third slot; and each fifth pad is arranged on a surface of the first bridge board and connected to the sixth pad.

6. The board-to-board connection structure for a PCB according to claim 1, wherein a plurality of sixth pads are provided, which are arranged around outer edge sides of the fifth pads, and each sixth pad is arranged on a surface of the first bridge board.

7. The board-to-board connection structure for a PCB according to claim 1, wherein the first partition board is provided with a first through hole, and the fifth pad is welded to the second pad by means of the first through hole.

8. The board-to-board connection structure for a PCB according to claim 7, wherein the plurality of second pads are provided, the number of the fifth pads and the number of the first through holes are the same as the number of the second pads, and positions of the second pads, the fifth pads and the first through holes are consistent.

9. The board-to-board connection structure for a PCB according to claim 8, wherein the second pads are located at the periphery of the first pads, and arranged around the first slot;
the fifth pads are located at the periphery of the sixth pads, and are arranged around the third slot; and
the first through holes are arranged around the second slot.

10. The board-to-board connection structure for a PCB according to claim 9, wherein the fifth pad and the sixth pad are connected to each other.

11. The board-to-board connection structure for a PCB according to claim 9, wherein the first through hole is a semi-circular first through hole.

12. The board-to-board connection structure for a PCB according to claim 7, wherein each of the first pad, the fifth pad and the sixth pad is provided with the semi-circular through hole.

13. The board-to-board connection structure for a PCB according to claim 7, wherein the semi-circular first through holes are respectively arranged on both outer sides of the first partition board for connecting the semi-circular holes of the second pads on a bottom board module and the semi-circular holes of the fifth pads on the both outer sides of the bridge board.

14. The board-to-board connection structure for a PCB according to claim 7, wherein the bottom board, the first partition board and the first bridge board are sequentially arranged in parallel, and the functional board is perpendicular to each of the bottom board, the first partition board and the first bridge board, respectively.

15. The board-to-board connection structure for a PCB according to claim 11, wherein the connection structure further comprises:
a second partition board, which is provided with a fourth slot, second through holes arranged around the fourth slot, and third through holes arranged around the fourth slot and located at the periphery of the second through holes; and
a second bridge board, which is provided with a fifth slot, and seventh pads, eighth pads and ninth pads which are arranged around the fifth slot, wherein the eighth pads are located at the periphery of the seventh pads, and the ninth pads are located at the periphery of the eight pads;
tenth pads are further arranged on the functional board, and the tenth pads are located between the fourth pads and the third pads;
eleventh pads are further arranged on the bottom board, and the eleventh pads are arranged around the first slot and located between the first pads and the second pads.

16. The board-to-board connection structure for a PCB according to claim 15, wherein the bottom of the functional board is inserted into the first slot, the fourth slot, the fifth slot, the second slot and the third slot in sequence, and thus the functional board is installed on the bottom board, the second partition board, the second bridge board, the first partition board, and the first bridge board;
the tenth pad is connected to the seventh pad;
the second pad is connected to the eighth pad by means of the second through hole, and the eighth pad is connected to the fifth pad by means of the first through hole; and
the eleventh pad is connected to the ninth pad by means of the third through hole.

17. The board-to-board connection structure for a PCB according to claim 16, wherein the cross section of the first partition board is less than cross sectional area of the second partition board; and
the cross section of the first bridge board is less than cross sectional area of the second bridge board.

18. The board-to-board connection structure for a PCB according to claim 17, wherein two rows of through-hole pads on the outer side of the first bridge board are respectively welded to two rows of outermost first pads and two rows of secondary outermost second pads at an interface region of a functional module of the bottom board.

* * * * *